United States Patent [19]

Economy et al.

[11] 4,379,826
[45] Apr. 12, 1983

[54] POSITIVE ELECTRON BEAM RESISTS OF ORTHO CHLORO SUBSTITUTED PHENOL OR CRESOL CONDENSED WITH FORMALDEHYDE

[75] Inventors: James Economy; Roy J. Gritter, both of San Jose; Hiroyuki Hiraoka, Saratoga, all of Calif.

[73] Assignee: International Business Machines Corporation, Armonk, N.Y.

[21] Appl. No.: 298,138

[22] Filed: Aug. 31, 1981

[51] Int. Cl.$^3$ .............. G03C 1/58; G03C 5/22; G03C 5/34; G03C 5/00
[52] U.S. Cl. .................. 430/141; 430/192; 430/296; 430/326; 204/159.14; 525/480
[58] Field of Search ........... 430/141, 296, 192, 270, 430/905, 326; 204/159.14; 525/480; 427/36

[56] References Cited

U.S. PATENT DOCUMENTS

| | | | |
|---|---|---|---|
| 3,728,293 | 4/1973 | Booth et al. | 525/480 |
| 3,802,885 | 4/1974 | Lawson et al. | 430/192 |
| 4,123,279 | 10/1978 | Kobayashi | 430/192 |
| 4,211,834 | 7/1980 | Lapadula et al. | 430/296 |

OTHER PUBLICATIONS

"Negative Photosensitive Materials," Lavreshchev et al., *Chem. Abst.* 70 53023m.

*Primary Examiner*—Richard L. Schilling
*Attorney, Agent, or Firm*—Joseph G. Walsh

[57] ABSTRACT

The sensitivity of a positive working electron beam resist is increased by using as the resist material a resin which is a condensation product of formaldehyde with a phenol or a cresol having a chloro substituent ortho to the hydroxyl group on its aromatic ring.

3 Claims, No Drawings

POSITIVE ELECTRON BEAM RESISTS OF ORTHO CHLORO SUBSTITUTED PHENOL OR CRESOL CONDENSED WITH FORMALDEHYDE

DESCRIPTION

1. Technical Field

The present invention is concerned with a process for forming a positive electron beam resist. In particular, it is concerned with such a process characterized in that the resist material is a condensation product of formaldehyde with a phenol or a cresol having a chlorine substituent ortho to the hydroxyl group on its aromatic ring.

2. Background Art

Positive electron beam resists are well-known in the art. They are used, for example, in microcircuit fabrication. The use in positive resist electron beam lithography of phenol or cresol-formaldehyde resins is also well known.

The use of sensitizers along with novalak resin resists during photolithographic operations is also known in the art and is shown, for example, in U.S. Pat. No. 3,802,885, where naphthoquinone-diazide compounds are shown as sensitizers. This patent, however, deals entirely with photolithography, and not electron beam lithography. Furthermore, it makes no mention of chloro substituents in the novalak resin.

U.S. Pat. No. 4,123,279 deals with a light sensitive printing plate. It shows the use of a photosensitizer. It also shows chloro substitution on the aromatic ring of a phenol-formaldehyde resin. The reference, however, merely shows random substitution of the chlorine and in no way teaches the totally unexpected advantage of the ortho substitution as found in the present invention.

USSR Author's Certificate No. 226,402 deals with negative photolithographic resists. This reference teaches that in negative working resists, the incorporation of a chloro substituent at random positions on the phenol portion of a phenol-formaldehyde resin increases sensitivity. It should be noted that this teaching is dealing with photolithography rather than electron beam lithography, but to the extent that an increase in negative sensitivity is obtained, this is directly contrary to the finding of the present invention.

DISCLOSURE OF THE INVENTION

We have found that the sensitivity of a phenol-formaldehyde resin or of a cresol-formaldehyde resin, when used as a positive resist in electron beam lithography, is greatly increased when chlorine is substituted in the aromatic ring ortho to the hydroxyl group. This discovery is all the more remarkable in view of the finding that substitution of chlorine in the meta position does not substantially change sensitivity at all, while substitution of chlorine in the para position actually changes the material into a negative working resist, instead of a positive working resist.

It is to be understood that the process of the present invention involves the conventional steps of forming a positive electron beam resist, i.e. imagewise exposing the resin to electron beam irradiation, and then selectively removing the exposed portion by treating it with a solvent. The present invention is characterized in that the resin is a condensation product of formaldehyde with a phenol or a cresol having a chloro substituent ortho to the hydroxyl group on its aromatic ring.

In carrying out the process of the present invention, it is desirable that a sensitizer be added to the resin. Many such sensitizing materials are known in the art. Particularly good results have been obtained using diazide derivatives of naphthoquinone, for example, 2,4-dihydroxybenzophenone-bis-(naphthoquinone-(1,2)-diazide-(2)-5 sulfonate).

The use of oxalic acid as a catalyst in the formation of the phenol-formaldehyde resin has given outstandingly and unexpectedly good results, as is disclosed in the example below. Alternative catalytic materials such as p-toluene-sulfonic acid may be used, but for some reason which is not understood, oxalic acid gives the best results.

The following examples are given solely for the purposes of illustration and are not to be considered limitations on the invention, many variations of which are possible without departing from the spirit or scope thereof.

Preparations of Resins:

A method for the preparation of the resins is as follows: 0.20 Mol of 2-chloro-5-methylphenol and s-trioxane corresponding to 0.18 mol of formaldehyde were mixed together with 0.08 Mol of oxalic acid, and dissolved in 10 ml of diglyme. The mixture was sealed in high vacuum after complete degassing. The reaction was carried out at 150° C. for several hours without stirring. Other kinds of phenol, such as simple phenol or 4-chloro-3-methyl-phenol, can replace 2-chloro-5-methyl-phenol. In these cases the reaction temperatures were lower and for a shorter period; for instance, 125° C. for 1 hour was adequate. When the reaction approached to the end, a solid mass of the polymer became isolated from the solution. After cooling, the solid resins were dissolved in acetone, and filtered through a sintered glass filter. The clear acetone solutions were poured into water which contained HCl in 1% in weight. The separated polymers were dried in vacuum at 120° C. for several hours. The resins were heated up to 175° C. in vacuum for 10 to 20 minutes before use.

Preparation of the Resists:

The resins thus prepared were mixed with 2,4-dihydroxy-benzophenone-bis-[naphthoquinone-(1,2)-diazide-(2)-5-sulfonate] in 20 weight%, and dissolved in diglyme, bis-(2-ethoxyethyl)ether. The resist films were cast from the diglyme solution onto a silicon wafer, which was then prebaked at 84° C. for 12.5 minutes in air.

Electron Beam Exposures and Developments of Images:

The electron beam exposures were carried out at dosages of $1 \times 10^{-5}$, $5 \times 10^{-6}$, $4.3 \times 10^{-6}$ Coul/cm$^2$ with scanning electron beams of 25 keV. After electron beam exposures, the polymer patterns were developed in AZ2401 developer diluted with four parts of water to 1 part of AZ2401. (AZ2401 is the Shipley Co. Trademark for a KOH based buffered developer.) The images were developed usually within 2 minutes.

Inspections of the Resist Patterns:

The developed patterns were inspected with a scanning electron microscope for the wall profile measurements, and with a step-profiler for the thickness measurements in order to gain the solubility ratio of the exposed and the unexposed parts.

With the 2-chloro-5-methyl-phenol-formaldehyde resin prepared with oxalic acid as catalyst, the solubility ratio $R/R = 5.9$ has been obtained in comparison with a commercial standard phenol-formaldehyde resist having $R/R_0 = 2.3$ as a control experiment. Vertical wall-profiles of 1 μm height of the developed patterns were obtained with a dosage of 4 to $5 \times 10^{-6}$ Coul/cm², in comparison with a commercial standard yielding the vertical wall profiles at $1 \times 10^{-5}$ Coul/cm².

With properly made ortho-chloro-substituted-cresol-formaldehyde resin, the resist has been demonstrated to have the high electron beam sensitivity, with a factor of 2 to 2.5 times of the resin not having the ortho chloro substituent. The developed resist patterns have high $CF_4$-plasma and reactive ion etch resistance.

We claim:

1. In a process for forming a positive electron beam resist by the steps of imagewise exposing a resin sensitized by a naphthoquinone diazide to electron beam irradiation, and selectively removing the exposed portion of the resin by treating it with a solvent, the improvement characterized in that the resin is a condensation product of formaldehyde with a phenol or a cresol having a chloro substituent ortho to the hydroxyl group on its aromatic ring.

2. A process as claimed in claim 1 wherein the resin is a condensation product of formaldehyde with ortho-chlorophenol.

3. A process as claimed in claim 1 wherein the resin has been formed by the condensation of formaldehyde with an ortho-chloro-substituted phenol or cresol in a reaction catalyzed by the presence of oxalic acid.

* * * * *